United States Patent
Maegawa et al.

(10) Patent No.: US 11,426,775 B2
(45) Date of Patent: Aug. 30, 2022

(54) CLEANING METHOD, METHOD FOR PRODUCING SILICON SINGLE CRYSTAL, AND CLEANING DEVICE

(71) Applicant: SUMCO CORPORATION, Tokyo (JP)

(72) Inventors: Koichi Maegawa, Tokyo (JP); Takuya Yotsui, Tokyo (JP); Satoru Hamakawa, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 46 days.

(21) Appl. No.: 16/955,455

(22) PCT Filed: Nov. 16, 2018

(86) PCT No.: PCT/JP2018/042585
§ 371 (c)(1),
(2) Date: Jun. 18, 2020

(87) PCT Pub. No.: WO2019/123928
PCT Pub. Date: Jun. 27, 2019

(65) Prior Publication Data
US 2020/0346258 A1    Nov. 5, 2020

(30) Foreign Application Priority Data
Dec. 20, 2017  (JP) .............................. JP2017-244098

(51) Int. Cl.
B08B 9/032     (2006.01)
B08B 9/035     (2006.01)
(Continued)

(52) U.S. Cl.
CPC .............. B08B 9/0326 (2013.01); B08B 5/04 (2013.01); B08B 9/035 (2013.01); B08B 9/0328 (2013.01);
(Continued)

(58) Field of Classification Search
CPC ...... C30B 15/00–36; C30B 35/00–007; C30B 21/06; C30B 27/02; C30B 28/10;
(Continued)

(56) References Cited

U.S. PATENT DOCUMENTS 5,527,019 A  *  6/1996  Schwarz ............ B01D 46/0093
                                             266/135
10,000,863 B2   6/2018  Okita
(Continued)

FOREIGN PATENT DOCUMENTS

CN    204779924 U  * 11/2015
CN    106574395 A    4/2017
(Continued)

OTHER PUBLICATIONS

Office Action for KR App. No. 10-2020-7019109, dated Aug. 30, 2021 (w/ translation).
(Continued)

*Primary Examiner* — Mikhail Kornakov
*Assistant Examiner* — Richard Z. Zhang
(74) *Attorney, Agent, or Firm* — Greenblum & Bernstein, P.L.C.

(57) ABSTRACT

A cleaning method includes a first removal step of causing an inert gas to which a pulsation is applied to flow into an exhaust pipe after a silicon single crystal doped with an n-type dopant is produced, to peel and remove a deposit; and a second removal step of causing an atmospheric air to which no pulsation is applied to flow into the exhaust pipe through a chamber to burn a part of the deposit with the atmospheric air, the part being not removable in the first removal step, and peel and remove a burned substance of the deposit.

11 Claims, 6 Drawing Sheets

(51) Int. Cl.
  *B08B 5/04* (2006.01)
  *C30B 15/04* (2006.01)
  *C30B 29/06* (2006.01)
  *C30B 15/00* (2006.01)
  *C30B 35/00* (2006.01)

(52) U.S. Cl.
  CPC .............. *C30B 15/04* (2013.01); *C30B 29/06* (2013.01); *B08B 2209/032* (2013.01); *C30B 15/00* (2013.01); *C30B 35/00* (2013.01)

(58) Field of Classification Search
  CPC ..... B08B 9/0326; B08B 9/00–46; B08B 5/04; B08B 9/0328; B08B 9/035; B08B 9/027–057; B08B 2209/032; C23C 16/4405; C23C 16/4408; C23C 16/4412
  See application file for complete search history.

(56) References Cited

U.S. PATENT DOCUMENTS

| | | | |
|---|---|---|---|
| 10,458,044 B2 | 10/2019 | Okita | |
| 2008/0053372 A1* | 3/2008 | Anttila | C30B 29/20 117/200 |
| 2011/0020544 A1* | 1/2011 | Matsumoto | H01L 21/28556 427/248.1 |
| 2013/0008381 A1* | 1/2013 | Fukumori | C23C 16/4412 118/715 |
| 2013/0306109 A1* | 11/2013 | Okita | C30B 35/007 134/22.18 |
| 2016/0333496 A1* | 11/2016 | Yanagimachi | C30B 15/203 |

FOREIGN PATENT DOCUMENTS

| | | | |
|---|---|---|---|
| CN | 107208306 A | | 9/2017 |
| DE | 41 30 640 | | 3/1993 |
| JP | S63319287 | * | 12/1988 |
| JP | 7-267772 | | 10/1995 |
| JP | 2000-219591 A | | 8/2000 |
| JP | 2009-57264 | | 3/2009 |
| JP | 2010-59028 | | 3/2010 |
| JP | 2012-66948 | | 4/2012 |
| JP | 2012-148906 | | 8/2012 |
| JP | 2012148906 A | * | 8/2012 |
| JP | 5644861 | | 11/2014 |
| JP | 2017-109882 A | | 6/2017 |
| KR | 20030078460 A | * | 10/2003 |
| KR | 10-2013-0023241 A | | 3/2013 |
| TW | 201245517 A | | 11/2012 |
| WO | 2012/131888 | | 10/2012 |
| WO | WO-2016125605 A1 | * | 8/2016 ............. C30B 29/06 |

OTHER PUBLICATIONS

English-language translation of IPRP for PCT/JP2018/042585, dated Jun. 23, 2020.
Notice of Allowance for JP App. No. 2017-244098, dated Dec. 22, 2020 (w/ partial translation).
Official Communication issued in International Bureau of WIPO Patent Application No. PCT/JP2018/042585, dated Feb. 12, 2019.
Office Action for CN App. No. 201880082530.1, dated May 28, 2021 (w/ translation).
Chinese Office Action issued in CN Patent application No. 201880032530.1, dated Jan. 29, 2022.

* cited by examiner

CLEANING METHOD, METHOD FOR PRODUCING SILICON SINGLE CRYSTAL, AND CLEANING DEVICE

TECHNICAL FIELD

The present invention relates to a cleaning method, a method for producing a silicon single crystal, and a cleaning device.

BACKGROUND ART

When a silicon single crystal doped with an n-type dopant (for example, antimony, arsenic, or red phosphorus) is produced, since the boiling point of the n-type dopant is lower than the melting point of silicon, the dopant in a melt evaporates to an atmosphere of a chamber; and thereby, the resistivity of the silicon single crystal becomes higher than a desired value, which is a concern. In order to prevent such a problem, when the growth of the silicon single crystal doped with the n-type dopant is performed, generally, the pressure of the chamber is increased.

However, when the pressure of the chamber is increased, the concentration of the evaporated substance in an inner atmosphere of an exhaust pipe becomes high, a deposit containing the evaporated substance of the dopant is deposited on an inner wall of the exhaust pipe. When the amount of the deposit in the exhaust pipe increases, the deposit flows back into the chamber and is mixed with a silicon melt or the silicon single crystal to cause a dislocation, which is a concern.

Therefore, a cleaning method for removing the deposit from the exhaust pipe has been studied (for example, refer to Patent Literature 1).

In the cleaning method disclosed in Patent Literature 1, firstly, the atmospheric air is allowed to flow into the exhaust pipe to burn a surface layer of the deposit by opening the chamber. Thereafter, opening and closing valves for cleaning are disposed in a plurality of exhaust holes in the chamber which communicate with the inside of the exhaust pipe, and a suction pump for cleaning is driven in a state where the opening and closing valves for cleaning are open. Accordingly, the atmospheric air to which no pulsation is applied flows into the exhaust pipe to burn the deposit, and burned substances are peeled and suctioned (hereinafter, referred to as a first step).

Subsequently, while the suction pump for cleaning is driven, all of the opening and closing valves for cleaning are closed for the moment and the pressure in the exhaust pipe is brought to a negative pressure, and any one of the opening and closing valves for cleaning is opened and closed; and thereby, a pressure fluctuation occurs in the exhaust pipe, which causes the pressure in the exhaust pipe to return to the atmospheric pressure, and the atmospheric air to which pulsation is applied flows into the exhaust pipe. Accordingly, the deposit which remains in the exhaust pipe is burned, and due to the pulsation of the atmospheric air, burned substances are peeled with a stronger peeling force and are suctioned (hereinafter, referred to as a second step).

CITATION LIST

Patent Literature

[Patent Literature 1] Japanese Patent No. 5644861

SUMMARY OF THE INVENTION

Problems to be Solved by the Invention

However, since the n-type dopant is more volatile during the production of the silicon single crystal than a p-type dopant, the deposit becomes thick, which is a concern. For this reason, even when the first step disclosed in Patent Literature 1 is performed, only a thin surface layer can be burned as a whole, and a large amount of unburned deposit remains, which is a concern. In addition, since the deposit is thick and has a strong adhering force, the deposit is not sufficiently peeled only in the first step where no pulsation is applied. Furthermore, when the second step is performed in a state where the unburned deposit is exposed, and the pulsation of the atmospheric air occurs, due to a pressure fluctuation, the unburned deposit rapidly reacts with the atmospheric air to ignite, which is a concern.

An object of the present invention is to provide a cleaning method, a method for producing a silicon single crystal, and a cleaning device capable of properly removing a deposit while preventing the ignition of the deposit containing an evaporated substance of a dopant deposited in a n exhaust pipe.

Means for Solving the Problems

According to an aspect of the invention, there is provided a cleaning method for removing a deposit containing an evaporated substance of a dopant deposited in an exhaust pipe in a single crystal pulling-up system including a chamber and the exhaust pipe that exhaust a gas in the chamber, the method including a first removal step of causing an inert gas to which a pulsation is applied to flow into the exhaust pipe after a silicon single crystal doped with an n-type dopant is produced, to peel and remove the deposit; and a second removal step of causing an atmospheric air to which no pulsation is applied to flow into the exhaust pipe through the chamber to burn a part of the deposit with the atmospheric air, the part being not removable in the first removal step, and peel and remove a burned substance of the deposit.

According to the above aspect of the invention, since in the first removal step, the deposit is peeled using the inert gas to which the pulsation is applied, it is possible to peel and remove the deposit with a peeling force which is stronger than that when the inert gas to which no pulsation is applied. In addition, since the inert gas is used as a gas to which a pulsation is applied and the deposit does not react with the inert gas, it is possible to prevent the ignition of the deposit.

Furthermore, since the atmospheric air to which no pulsation is applied is used in the second removal step, a large pressure fluctuation does not occur, and the atmospheric air does not rapidly react with the unburned deposit; and thereby, it is possible to prevent ignition. In addition, since the thickness of the deposit becomes thinned by executing the first removal step, it is possible to burn the deposit over the entire area in a thickness direction thereof, and even when the atmospheric air to which no pulsation is applied and which does not have a strong peeling force is used, it is possible to peel and remove the entire remainder of the deposit.

Therefore, it is possible to properly remove the deposit while preventing the ignition of the deposit deposited in the exhaust pipe.

Incidentally, in the invention, the term "atmospheric air" is a collection of gases surrounding the earth, and implies containing nitrogen, oxygen, hydrogen, argon, carbon dioxide, ozone, neon, helium, water vapor, and the like as components.

In the cleaning method of the invention, it is preferable that the single crystal pulling-up system is provided with a vacuum pump that regulates a pressure in the chamber during production of the silicon single crystal, and a blower that suctions the deposit in the exhaust pipe, it is preferable that the first removal step peels the deposit and suctions the deposit with the blower by causing the inert gas to which the pulsation is applied to flow into the exhaust pipe in a state where a drive of the vacuum pump is stopped and the blower is driven, and it is preferable that the second removal step peels the burned substance and suctions the burned substance with the blower, which is burned with the atmospheric air to which no pulsation is applied.

According to the above aspect of the invention, in the first and second removal steps, since in addition to the vacuum pump that is generally provided in the single crystal pulling-up system, the blower which suctions the deposit is provided, it is possible to remove the deposit with a strong peeling force.

In the cleaning method of the invention, it is preferable that the single crystal pulling-up system is provided with a vacuum pump that regulates a pressure in the chamber during production of the silicon single crystal, it is preferable that the first removal step peels the deposit and suctions the deposit with the vacuum pump by causing the inert gas to which the pulsation is applied to flow into the exhaust pipe in a state where the vacuum pump is driven, and it is preferable that the second removal step peels the burned substance and suctions the burned substance with the vacuum pump, which is burned with the atmospheric air to which no pulsation is applied.

According to the above aspect of the invention, since the vacuum pump which is generally provided in the single crystal pulling-up system is used in the first and second removal steps, it is not necessary to provide the blower in a single crystal pulling-up system in the related art, and it is possible to prevent the configuration from becoming complicated or an increase in cost.

In the cleaning method of the invention, it is preferable that the chamber includes a main chamber and a pull chamber, it is preferable that in the first removal step, the pull chamber is removed from the main chamber and exhaust hole opening and closing means is disposed in an exhaust hole in the main chamber which communicates with an inside of the exhaust pipe, a connection opening in the main chamber, which is connected to the pull chamber, is closed with a lid, the exhaust hole opening and closing means closes the exhaust hole to bring a pressure in the exhaust pipe to a negative pressure, the main chamber is filled with the inert gas through a supply pipe provided in the lid, and the exhaust hole opening and closing means opens and closes the exhaust hole to generate a pressure fluctuation in the exhaust pipe, which causes the pressure in the exhaust pipe to return to a pressure of the main chamber, so that the inert gas to which the pulsation is applied flows into the exhaust pipe, and it is preferable that in the second removal step, the exhaust hole opening and closing means opens the exhaust hole, and the lid is moved away from the connection opening, a valve provided in the lid is opened, or the main chamber is floated off from a floor, so that the atmospheric air to which no pulsation is applied flows into the exhaust pipe.

According to the above aspect of the invention, the inert gas with which the main chamber is filled is allowed to flow into the exhaust pipe in a state where the pulsation is applied to the inert gas by a simple method where the main chamber is partitioned off from a connection pipe by closing the exhaust hole with the exhaust hole opening and closing means, the pressure in the exhaust pipe is brought to a negative pressure, the main chamber is filled with the inert gas, and then the exhaust hole is merely opened and closed. In addition, the atmospheric air to which no pulsation is applied is allowed to flow into the exhaust pipe by a simple method for merely moving the lid away from the connection opening or merely opening the valve provided in the lid.

In the cleaning method of the invention, it is preferable that the chamber includes a main chamber and a pull chamber, it is preferable that the main chamber includes a plurality of divided chambers that are dividable, it is preferable that in the first removal step, the pull chamber is removed from the main chamber and exhaust hole opening and closing means is disposed in an exhaust hole in the main chamber which communicates with an inside of the exhaust pipe, a connection opening in the main chamber, which is connected to the pull chamber, is closed with a lid, the exhaust hole opening and closing means closes the exhaust hole to bring a pressure in the exhaust pipe to a negative pressure, the main chamber is filled with the inert gas through a supply pipe provided in the lid, and the exhaust hole opening and closing means opens and closes the exhaust hole to generate a pressure fluctuation in the exhaust pipe, which causes the pressure in the exhaust pipe to return to a pressure of the main chamber, so that the inert gas to which the pulsation is applied flows into the exhaust pipe, and it is preferable that in the second removal step, the exhaust hole opening and closing means opens the exhaust hole and one of the plurality of divided chambers is moved to form a gap between another divided chamber and the one, so that the atmospheric air to which no pulsation is applied flows into the exhaust pipe.

According to the above aspect of the invention, the inert gas with which the main chamber is filled is allowed to flow into the exhaust pipe in a state where the pulsation is applied to the inert gas by the foregoing simple method. In addition, the atmospheric air to which no pulsation is applied is allowed to flow into the exhaust pipe by a simple method for merely moving one of the plurality of divided chambers to form a gap between another divided chamber and the one.

In the cleaning method of the invention, it is preferable that a main chamber side end portion in the exhaust pipe is divided into a plurality of branch portions, it is preferable that the main chamber is provided with a plurality of the exhaust holes that communicate with insides of the branch portions of the exhaust pipe, and it is preferable that in the first removal step, the exhaust hole opening and closing means is disposed in the plurality of exhaust holes, and a step of opening and closing the exhaust holes with the exhaust hole opening and closing means except for at least one of a plurality of the exhaust hole opening and closing means to cause the inert gas to which the pulsation is applied to flow into the exhaust pipe, and a step of filling the main chamber with the inert gas through the supply pipe are repeated a plurality of times.

According to the above aspect of the invention, it is possible to further increase the amount of the inert gas flowing into each of the exhaust holes, and it is possible to further intensify a peeling force than those when the plurality of exhaust holes are simultaneously opened and closed with the exhaust hole opening and closing means.

In the cleaning method of the invention, it is preferable that in the first removal step, after a differential pressure between the chamber and the exhaust pipe becomes 20 kPa or greater, the exhaust hole is opened and closed to apply the pulsation to the inert gas.

According to the above aspect of the invention, the peeling force in the first removal step becomes stronger, and it is possible to thin a remaining unburned deposit at the start of the second removal step.

In the cleaning method of the invention, it is preferable that the exhaust pipe is provided with a rising portion extending vertically, it is preferable that falling object trapping means is provided at a lower end of the rising portion, and it is preferable that in the first removal step and the second removal step, the falling object trapping means traps a part of the deposit, which is not passable through the rising portion and falls due to an own weight.

According to the above aspect of the invention, since the falling object trapping means is provided at the lower end of the rising portion, it is possible to trap the deposit and prevent the exhaust pipe from becoming clogged by a simple method for merely using the own weight of the deposit. In addition, a heavy deposit which falls due to the own weight can be prevented from colliding with a device that suctions the deposit; and thereby, it is possible to prevent damage to the device.

In the cleaning method of the invention, it is preferable that powder trapping means is provided in the exhaust pipe at a position that is opposite to that of the chamber with respect to the falling object trapping means, and it is preferable that in the first removal step and the second removal step, the powder trapping means traps a powder contained in the deposit.

According to the above aspect of the invention, light powder which has passed through the rising portion can be prevented from adhering to the device that suctions the deposit; and thereby, it is possible to prevent damage to the device.

According to an another aspect of the invention, there is provided a method for producing a silicon single crystal, the method including producing a silicon single crystal doped with an n-type dopant using a single crystal pulling-up system in which a deposit is removed from an exhaust pipe by the foregoing cleaning method.

According to the above aspect of the invention, it is prevented that the deposit flows back into the chamber and is mixed with a silicon melt or the silicon single crystal to cause a dislocation; and thereby, it is possible to improve the productivity of the silicon single crystal.

According to still another aspect of the invention, there is provided a cleaning device that is used in a single crystal pulling-up system including a chamber including a main chamber and a pull chamber, a gas introduction unit introducing an atmospheric air into the chamber, an exhaust pipe exhausting a gas in the chamber, and a vacuum pump regulating a pressure in the chamber through the exhaust pipe, and removes a deposit containing an evaporated substance of a dopant deposited in the exhaust pipe, the device including a blower that suctions the deposit in the exhaust pipe; exhaust hole opening and closing means for opening and closing an exhaust hole in the main chamber which communicates with an inside of the exhaust pipe; a lid that closes a connection opening in the main chamber, which is connected to the pull chamber; and inert gas supply means for filling the main chamber with an inert gas through a supply pipe provided in the lid.

DESCRIPTION OF THE EMBODIMENTS

[Configuration of Single Crystal Pulling-Up System]

Hereinafter, an embodiment of the invention will be described with reference to the drawings.

Figure 1:
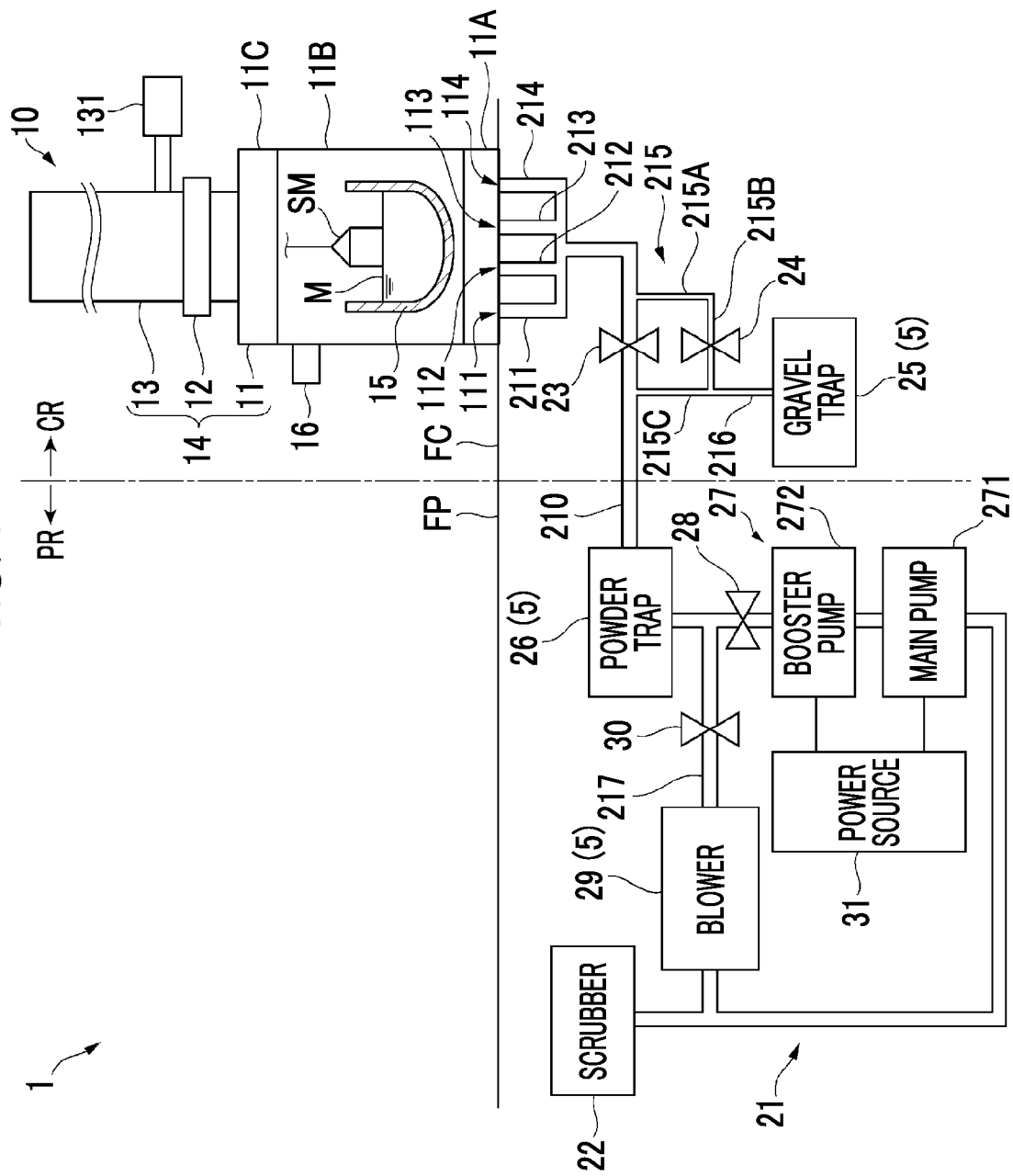
FIG. 1 is a schematic diagram illustrating a configuration of a single crystal pulling-up system according to an embodiment of the invention.

As illustrated in FIG. 1, a single crystal pulling-up system 1 includes a pulling-up device 10. The pulling-up device 10 is used for producing a silicon single crystal SM by the Czochralski process, and is installed under a floor FC of a clean room CR. The pulling-up device 10 includes a chamber 14 including a main chamber 11 and a pull chamber 13 that is installed above the main chamber 11 with a gate valve 12 interposed between the main chamber 11 and the pull chamber 13.

The main chamber 11 is mounted on the floor FC. The main chamber 11 includes first to third divided chambers 11A to 11C. The first divided chamber 11A is disposed on the floor FC, and the third divided chamber 11C is disposed uppermost. The main chamber 11 is provided with a crucible 15 that accommodates a silicon melt M doped with an n-type dopant, and a pressure gauge 16 that measures a pressure in the main chamber 11. In addition, a bottom portion of the main chamber 11 is provided with first to fourth exhaust holes 111 to 114 that communicate with the bottom portion. FIG. 1 illustrates the first to fourth exhaust holes 111 to 114 that are disposed side by side in a lateral direction. However, actually, when viewed from above, the first to fourth exhaust holes 111 to 114 are disposed to be positioned at four corners of a virtual square.

A gas introduction unit 131 for introducing an inert gas such as an Ar gas or the atmospheric air into the main chamber 11 is connected to the pull chamber 13.

In addition, the single crystal pulling-up system 1 includes an exhaust pipe 21, a scrubber 22, a main valve 23, a conductance valve 24, a gravel trap 25 as falling object trapping means, a powder trap 26 as powder trapping means, a vacuum pump 27, a pump valve 28, a blower 29, and a blower valve 30.

The exhaust pipe 21 includes a main pipe 210. The scrubber 22 is provided at one end of the main pipe 210. The scrubber 22 causes deposits which have passed through the powder trap 26 to turn into sludge.

First to fourth branch pipes 211 to 214 are connected to the other end of the main pipe 210. The first to fourth branch pipes 211 to 214 are provided such that the insides thereof communicate with the first to fourth exhaust holes 111 to 114 of the main chamber 11.

The main valve 23 is provided on a chamber 14 side of the main pipe 210.

The main pipe 210 is provided with a first bypass pipe 215 that is connected to both sides of the main pipe 210 between which the main valve 23 is interposed. The first bypass pipe 215 includes a first rising portion 215A that extends below the main valve 23 from the chamber 14 side, a horizontal portion 215B that extends from a lower end of the first rising portion 215A in a horizontal direction, and a second rising portion 215C that extends upward from an extension tip of the horizontal portion 215B and is connected to a side which is opposite to the chamber 14 with respect to the main valve 23.

The conductance valve 24 is provided in the horizontal portion 215B.

The gravel trap 25 is provided at a lower end of the second rising portion 215C in a state where a gravel pipe 216 extending downward is interposed between the gravel trap 25 and the second rising portion 215C. The gravel trap 25 is formed into a box shape, and traps deposits that have passed the second rising portion 215C but cannot pass through the second rising portion 215C and fall due to the own weight. The first bypass pipe 215 and the gravel pipe 216 are thinner than the main pipe 219. Incidentally, the gravel trap 25 may not be provided.

The powder trap 26 is provided in a portion of the main pipe 210 which is closer to the scrubber 22 than a connection portion between the main pipe 210 and the second rising portion 215C. Incidentally, the powder trap 26 may not be provided.

The vacuum pump 27 is provided in a portion of the main pipe 210 which is closer to the scrubber 22 than the powder trap 26. The vacuum pump 27 includes a main pump 271 and a booster pump 272 that is provided closer to the powder trap 26 than the main pump 271. The main pump 271 and the booster pump 272 are driven by electric power from a power source 31. The main pump 271 and the booster pump 272 are devices which aim to mainly lower the pressure and of which the attainable degree of vacuum is as high as less than 0.1 kPa (high vacuum) and the exhaust capacity is lower than that of the blower 29.

The pump valve 28 is provided in the main pipe 210 between the powder trap 26 and the booster pump 272.

The main pipe 210 is provided with a second bypass pipe 217 that connects a portion of the main pipe 210 between the powder trap 26 and the pump valve 28 and a portion thereof between the main pump 271 and the scrubber 22.

The blower 29 is provided on a scrubber 22 side of the second bypass pipe 217, and the blower valve 30 is provided on a powder trap 26 side thereof.

Since the blower 29 aims to mainly suction an object and a gap between a blade portion and a case portion in the blower 29 which are not illustrated is wider than that in the main pump 271 or the booster pump 272, a trouble such as the foregoing gap being clogged with foreign matter is unlikely to occur. In addition, due to the foregoing wide gap, the blower 29 has a higher attainable vacuum pressure value than that of the main pump 271 or the booster pump 272, and remains in a low vacuum state; and thereby, it is possible to prevent damage to an electromagnetic valve 56 to be described later or reduce a load for driving first to fourth pistons 51A to 54A.

The main valve 23, the conductance valve 24, and the gravel trap 25 are installed under the floor FC of the clean room CR. The scrubber 22, the powder trap 26, the vacuum pump 27, the pump valve 28, the blower 29, the blower valve 30, and the power source 31 are installed under a floor FP of a pump room PR. In addition, the exhaust pipe 21 includes the main pipe 210, the first to fourth branch pipes 211 to 214, the first bypass pipe 215, the gravel pipe 216, and the second bypass pipe 217.

Figure 2:
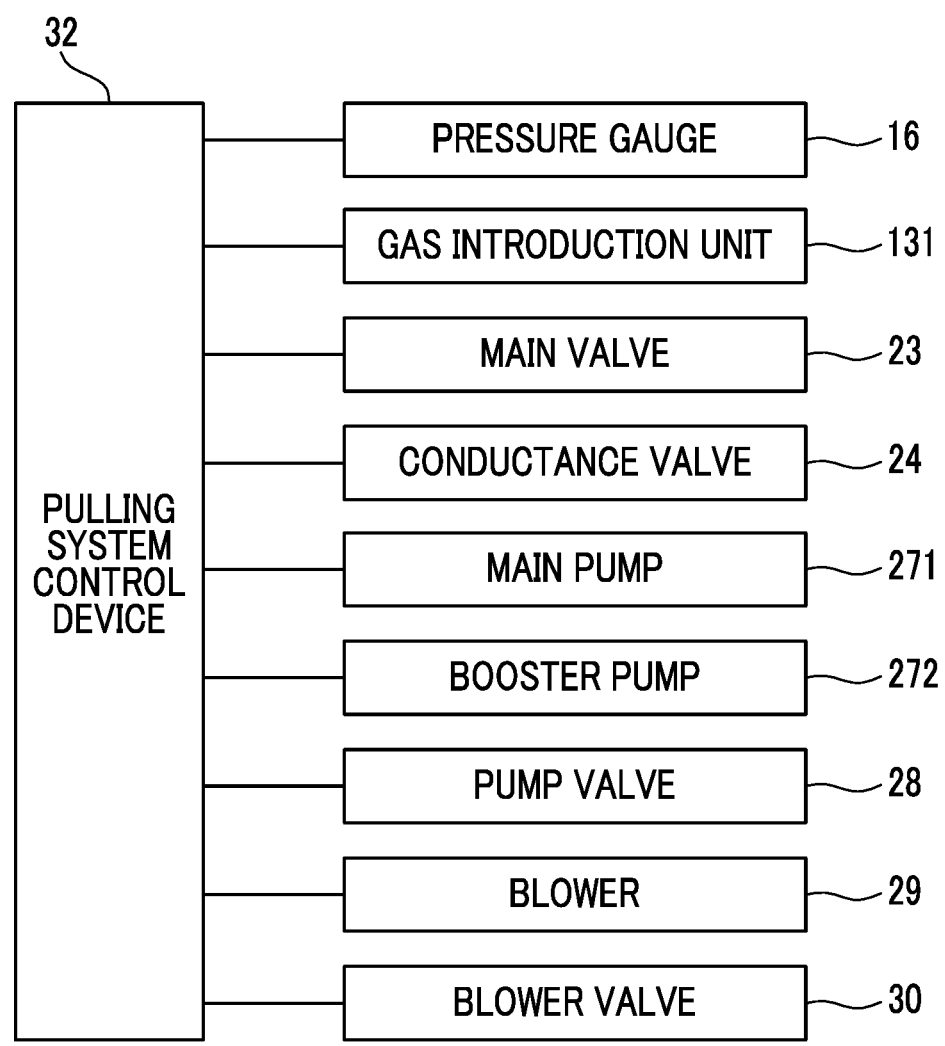
FIG. 2 is a block diagram of the single crystal pulling-up system in the embodiment.

In addition, as illustrated in FIG. 2, the single crystal pulling-up system 1 includes a pulling-up system control device 32.

The pulling-up system control device 32 is configured to be able to control the pressure gauge 16, the gas introduction unit 131, the main valve 23, the conductance valve 24, the main pump 271, the booster pump 272, the pump valve 28, the blower 29, and the blower valve 30.

[Configuration of Cleaning Device]

Figure 3:
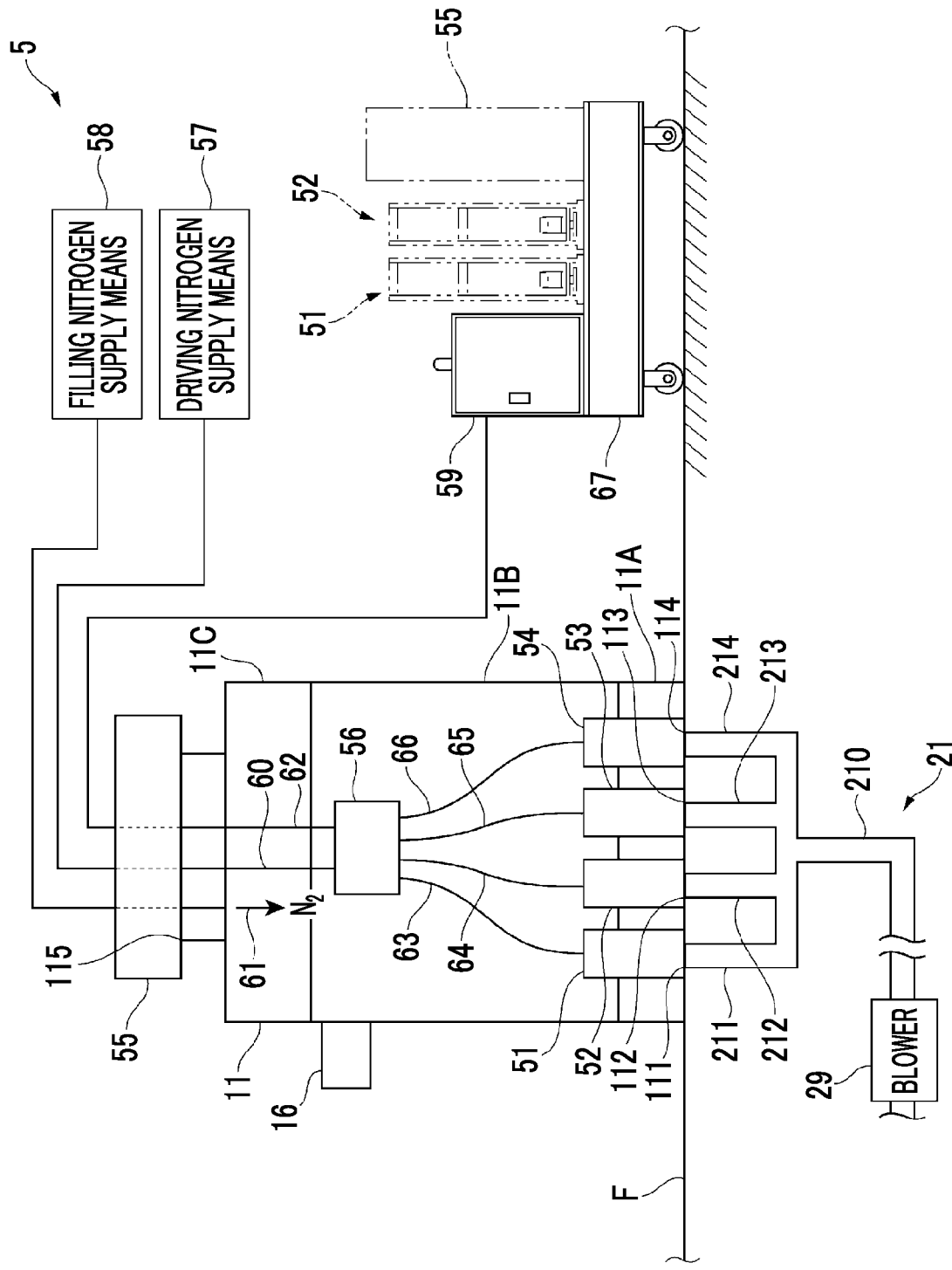
FIG. 3 is a schematic diagram illustrating the configuration of a cleaning device in the embodiment.

Subsequently, a cleaning device 5 will be described. The cleaning device 5 as illustrated in FIG. 3 removes the dopant deposited as a deposit DP (refer to FIG. 4) in the exhaust pipe 21 or an evaporated substance such as SiO or $SiO_2$. Incidentally, when the silicon single crystal SM is doped with a p-type dopant, the deposit DP is less than that when the silicon single crystal SM is doped with the n-type dopant. The cleaning device 5 includes first to fourth exhaust hole opening and closing means 51 to 54, a lid 55, the electromagnetic valve 56, driving nitrogen supply means 57, filling nitrogen supply means 58 as inert gas supply means, a cleaning control device 59, the gravel trap 25 described above, the powder trap 26 described above, and the blower 29 described above.

Figure 4:
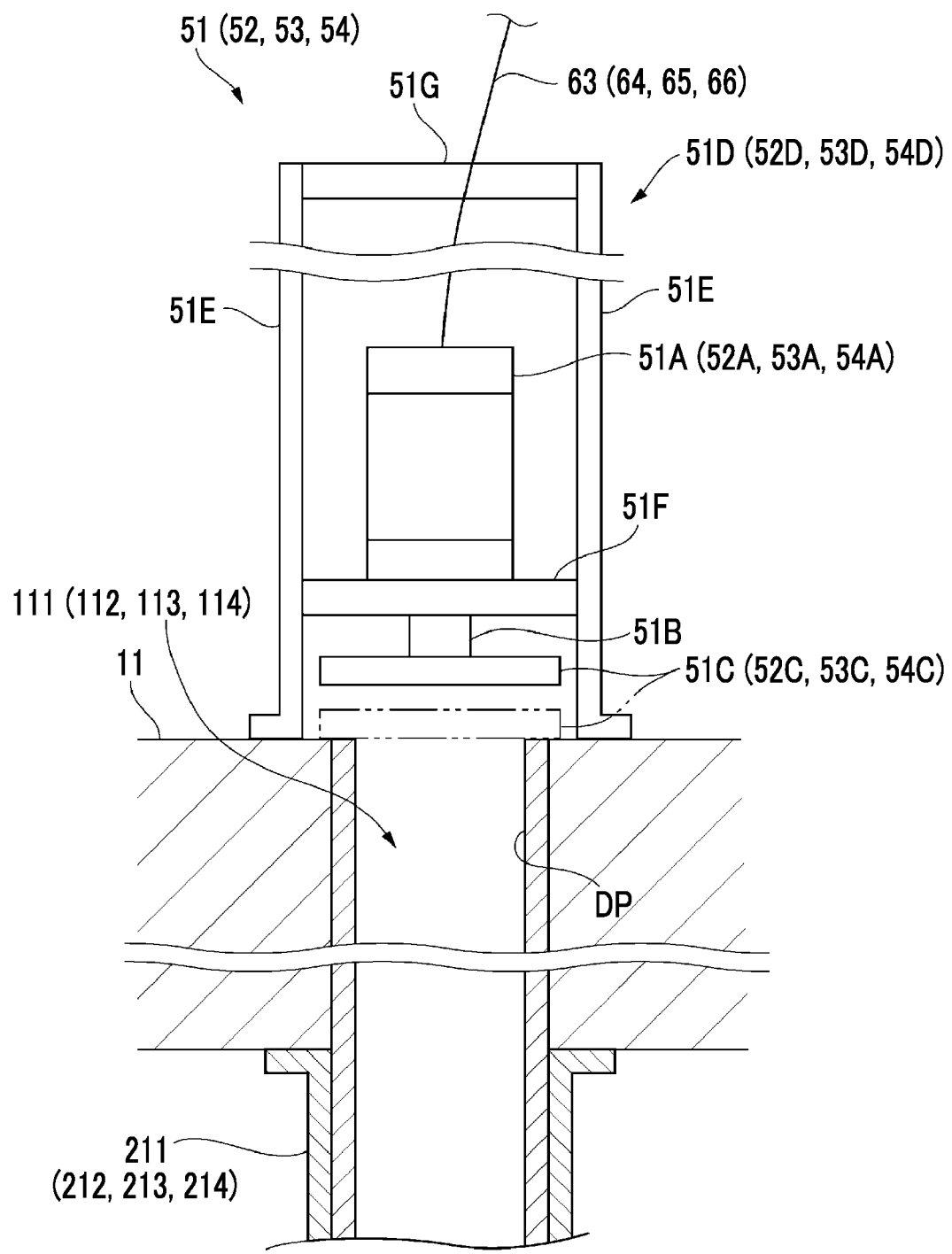
FIG. 4 is a cross-sectional view illustrating first to fourth exhaust hole opening and closing means in the embodiment.

As illustrated in FIG. 4, the first exhaust hole opening and closing means 51 opens and closes the first exhaust hole 111, the second exhaust hole opening and closing means 52 opens and closes the second exhaust hole 112, the third exhaust hole opening and closing means 53 opens and closes the third exhaust hole 113, and the fourth exhaust hole opening and closing means 54 opens and closes the fourth exhaust hole 114.

The first exhaust hole opening and closing means 51 includes the first piston 51A, a first opening and closing valve 51C that is attached to a tip of a rod 51B of the first piston 51A, and a piston holding portion 51D that holds the first piston 51A.

The nitrogen gas supplied from the driving nitrogen supply means 57 causes the first opening and closing valve 51C of the first piston 51A to move forward and backward.

The planar shape of the first opening and closing valve 51C is larger than the planar shape of the first exhaust hole 111.

The piston holding portion 51D includes four legs 51E that are vertically provided side by side in the shape of a quadrilateral, a holding plate 51F that is supported slightly above lower ends of the legs 51E, and four handles 51G that connect the legs 51E adjacent to each other. The first piston 51A is disposed on the holding plate 51F such that the rod 51B protrudes downward.

Then, since the first exhaust hole opening and closing means 51 is disposed such that the lower ends of the legs 51E surround the first exhaust hole 111, the first opening and closing valve 51C can open and close the first exhaust hole 111.

The second to fourth exhaust hole opening and closing means 52 and 54 are configured similar to the first exhaust hole opening and closing means 51, and include the second to fourth pistons 52A to 54A, second to fourth opening and closing valves 52C to 54C that are attached to tips of rods 52B to 54B of the second to fourth pistons 52A to 54A, and piston holding portions 52D to 54D that hold the second to fourth pistons 52A to 54A.

A driving nitrogen supply pipe 60 as a supply pipe connected to the driving nitrogen supply means 57, a filling nitrogen supply pipe 61 connected to the filling nitrogen supply means 58, and a lead wire 62 connected to the cleaning control device 59 are provided in the lid 55 to penetrate therethrough. The lid 55 is configured to be able to seal the main chamber 11 by being attached to close a connection opening 115 in the main chamber 11, the connection opening 115 being connected to the pull chamber 13.

When the lid 55 is attached to the connection opening 115, a tip of the filling nitrogen supply pipe 61 is positioned in the main chamber 11, and the main chamber 11 can be filled with nitrogen gas ($N_2$) as an inert gas from the filling nitrogen supply pipe 61.

The electromagnetic valve 56 is disposed in the main chamber 11. The electromagnetic valve 56 is electrically connected to the cleaning control device 59 via the lead wire 62. A tip of the driving nitrogen supply pipe 60 is connected to the electromagnetic valve 56. In addition, the first to fourth pistons 51A to 54A are connected to the electromagnetic valve 56 via connection pipes 63 to 66.

Under the control of the cleaning control device 59, the electromagnetic valve 56 supplies the nitrogen gas from the driving nitrogen supply means 57 to any one of the first to fourth pistons 51A to 54A to independently drive the piston to which the nitrogen gas supplied.

The first to fourth exhaust hole opening and closing means 51 to 54, the lid 55, the electromagnetic valve 56, and the cleaning control device 59 can be placed and transported on a carriage 67.

[Cleaning Method Using Cleaning Device]

Figure 5:
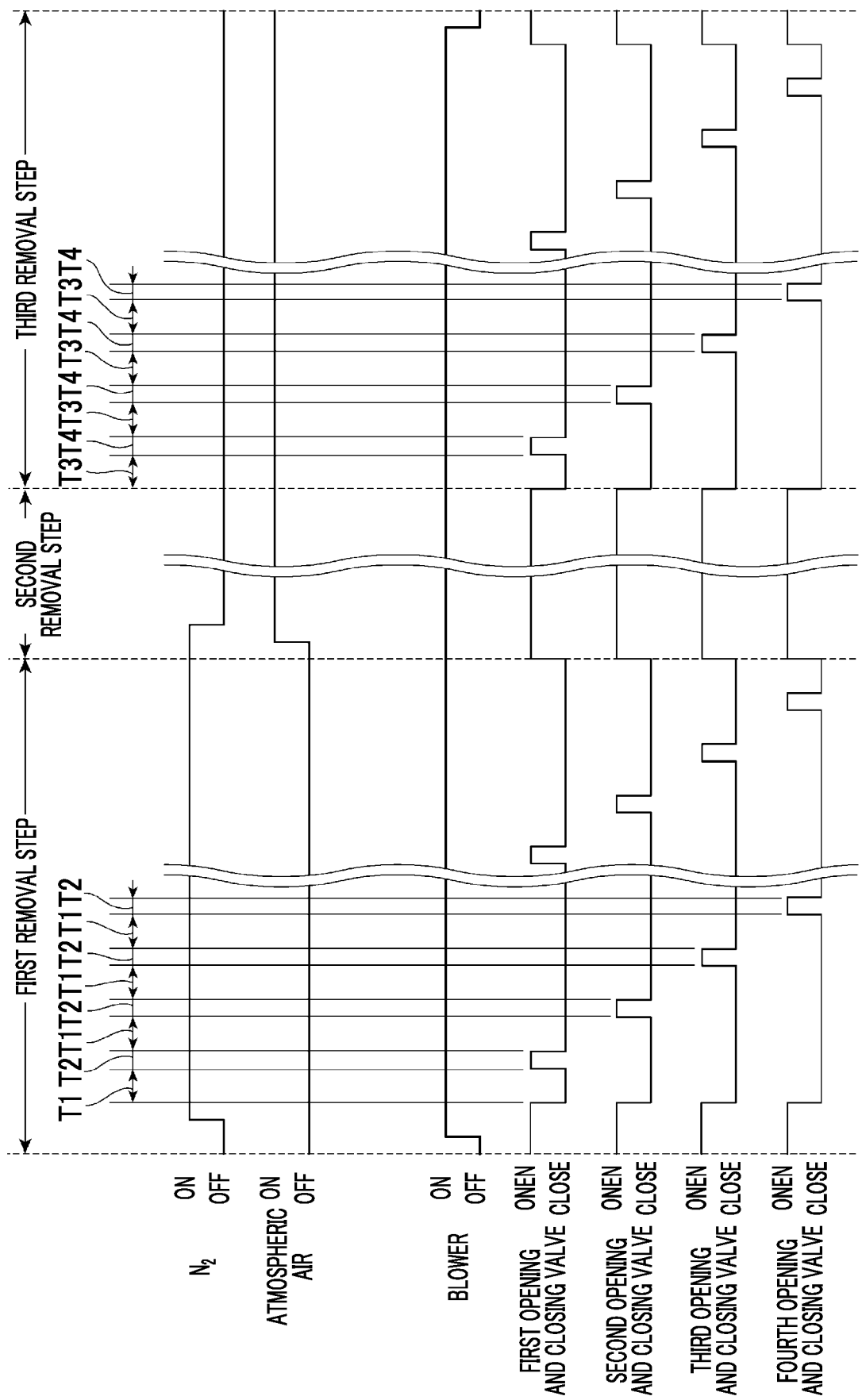
FIG. 5 is a timing chart illustrating a cleaning method in the embodiment.

Subsequently, a cleaning method for the exhaust pipe using the cleaning device 5 will be described. Incidentally, in FIG. 5, the introduction of an inert gas (Ar or nitrogen) or the atmospheric air or the drive of the vacuum pump 27 or the blower 29 is illustrated as "ON", and the stopping of the introduction of the inert gas or the like or the stopping of the drive of the vacuum pump 27 or the like is illustrated as "OFF".

Firstly, the pulling-up system control device 32 of the single crystal pulling-up system 1 produces the silicon single crystal SM doped with the n-type dopant such as antimony, arsenic, or red phosphorus. The target resistivity in a straight body portion of the silicon single crystal SM is from 10 mΩ·cm to 50 mΩ·cm in the case of antimony, is from 1.2 mΩ·cm to 4.0 mΩ·cm in the case of arsenic, and is from 0.5 mΩ·cm to 1.3 mΩ·cm in the case of red phosphorus. The diameter of the silicon single crystal SM is not specifically limited, and may be, for example, 100 mm, 125 mm, 150 mm, 200 mm, 300 mm, or 450 mm.

In a pulling-up step of pulling up the silicon single crystal SM, the pulling-up system control device 32 controls the gas introduction unit 131 to introduce only an Ar gas (inert gas). In addition, the pulling-up system control device 32 brings the pressure of the chamber 14 to a pressure from 0.5 kPa to 5 kPa by closing the conductance valve 24 and the blower valve 30, opening the main valve 23 and the pump valve 28, and driving the vacuum pump 27. Then, the crucible 15 is heated to generate the silicon melt M.

Subsequently, the pulling-up system control device 32 maintains the chamber 14 in an inert gas atmosphere with a pressure of 0.5 kPa or greater and less than 5 kPa by opening the conductance valve 24 and closing the main valve 23.

Then, after doping the silicon melt M with the n-type dopant, the pulling-up system control device 32 pulls up the silicon single crystal SM from the silicon melt M by bringing the pressure of the chamber 14 to a pressure from 5 kPa to 80 kPa and raising the crucible 15 while rotating the crucible 15.

In the pulling-up step, as illustrated in FIG. 4, the deposit DP is deposited on the chamber 14 side rather than a powder trap 26 side in the main pipe 210, and on inner walls of the first to fourth branch pipes 211 to 214 and the first bypass pipe 215. Since the n-type dopant has a higher volatility than that of the p-type dopant, the thickness of the deposit DP is approximately 1 cm thicker than that when the p-type dopant is used.

When a lower end of the silicon single crystal SM is separated from the silicon melt M, the process proceeds to a cooling step. During the cooling step, the pulling-up system control device 32 performs a burning step.

In the burning step, after introducing the atmospheric air from the gas introduction unit 131 into the chamber 14, the pulling-up system control device 32 stops introducing the Ar gas. Accordingly, the atmospheric air to which no pulsation is applied flows into the exhaust pipe 21 through the chamber 14, and a surface layer of the deposit DP reacts with the atmospheric air and is burned.

In the burning step, since the deposit DP is thick and adheres to the exhaust pipe 21 and no pulsation is applied to the atmospheric air, the deposit DP which is burned remains as it is without almost no peeling. In addition, when the thickness of the deposit DP before the burning step is 100%, in the burning step, a surface layer with a thickness of approximately 50% on a surface side burns.

After the burning step is performed for a predetermined time, when the cooling step is ended, the silicon single crystal SM is taken out of the main chamber 11. Then, the pulling-up system control device 32 ends the production of the silicon single crystal SM by stopping driving the vacuum pump 27 and closing the conductance valve 24 and the pump valve 28.

Thereafter, the cleaning device 5 performs first to third removal steps to remove the deposit DP deposited in the exhaust pipe 21.

In the first removal step, an operator performs an operation to remove the gate valve 12 and the pull chamber 13 from the main chamber 11, and as illustrated in FIG. 3, to dispose the first to fourth exhaust hole opening and closing means 51 to 54 so that the first to fourth exhaust holes 111 to 114 can be closed therewith. In addition, the electromagnetic valve 56 is disposed in the main chamber 11 by using a jig (not illustrated), and the main chamber 11 is sealed by covering the connection opening 115 with the lid 55.

Thereafter, the blower 29 is driven to suction the inside of the main chamber 11 in a state where the cleaning control device 59 opens the first to fourth exhaust holes 111 to 114 with the first to fourth exhaust hole opening and closing means 51 to 54 and the pulling-up system control device 32 closes the pump valve 28 and opens the blower valve 30. In this case, since the connection opening 115 is closed with the lid 55, no new atmospheric air is introduced into the main chamber 11. Then, after a predetermined time has elapsed, the cleaning control device 59 replaces the atmospheric air in the main chamber 11 and the exhaust pipe 21 with the nitrogen gas by causing the filling nitrogen supply means 58 to introduce the nitrogen gas into the main chamber 11.

It is preferable that the flow rate of the nitrogen gas is from 200 mL/min to 1,000 mL/min.

In addition, it is preferable that the exhaust air amount of the blower 29 is from 2 m³/min to 10 m³/min.

Subsequently, the cleaning control device 59 closes the first to fourth exhaust holes 111 to 114 substantially simultaneously to partition the main chamber 11 off from the blower 29, to fill the main chamber 11 with the nitrogen gas, and to bring the pressure in the exhaust pipe 21 to a negative pressure (inert gas filling step).

Then, when a time T1 from the closing of the first to fourth exhaust holes 111 to 114 has elapsed, the cleaning control device 59 opens the first exhaust hole 111 for a time T2 to generate a pressure fluctuation in the exhaust pipe 21, which causes the pressure in the exhaust pipe 21 to return to the pressure of the main chamber 11, and thus to allow the nitrogen gas to which pulsation is applied to flow into the exhaust pipe 21 through the first exhaust hole 111 (pulsation applying step).

Accordingly, it is possible to peel and remove the surface layer of the deposit DP from the first branch pipe 211 and the exhaust pipe 21 downstream thereof with a peeling force which is stronger than that when the nitrogen gas to which no pulsation is applied is used. In addition, even when an unburned part of the deposit DP is exposed by the peeling of the burned surface layer, the exposed part of the deposit DP does not react with the nitrogen gas, and the remainder of the deposit DP does not become very hot; and thereby, it is possible to prevent ignition. Furthermore, owing to the strong peeling force, it is possible to peel and remove also a surface layer of the unburned part of the deposit DP in addition to a surface layer of the burned portion without causing ignition.

When the first exhaust hole 111 is closed (when the pulsation applying step is ended), all of the first to fourth exhaust holes 111 to 114 become closed, and thus, the process proceeds to the inert gas filling step again. Then, when the time T1 has elapsed, in this time, the cleaning control device 59 opens only the second exhaust hole 112 for the time T2 to allow the nitrogen gas to which pulsation is applied to flow into the exhaust pipe 21 through the second exhaust hole 112 (pulsation applying step). Accordingly, it is possible to remove the surface layer of the deposit DP from the second branch pipe 212 and the exhaust pipe 21 downstream thereof.

Thereafter, similarly, the cleaning control device 59 performs the inert gas filling step for the time T1, the pulsation applying step of opening only the third exhaust hole 113 for the time T2, the inert gas filling step for the time T1, and the pulsation applying step of opening only the fourth exhaust hole 114 for the time T2.

Thereafter, the cleaning control device 59 ends the first removal step, as necessary, by sequentially performing the inert gas filling step and the pulsation applying step of opening and closing only one of the first to fourth exhaust holes 111 to 114.

Incidentally, it is preferable that a differential pressure between the main chamber 11 and the exhaust pipe 21 when the process proceeds from the inert gas filling step to the pulsation applying step is 20 kPa or greater.

The time T1 for the inert gas filling step depends on the size of the main chamber 11 or the flow rate of the nitrogen gas, and it is preferable that the time T1 is from ten seconds to thirty seconds. It is possible to sufficiently increase the differential pressure by setting the time T1 to ten seconds or greater. In addition, it is possible to prevent the cleaning time from becoming lengthy by setting the time T1 to thirty seconds or less.

The time T2 for opening the first to fourth exhaust holes 111 to 114 depends on the pressure or size of the main chamber 11, and it is preferable that the time T2 is one second or less. It is possible to prevent reflected waves of the nitrogen gas, which has flown into the exhaust pipe 21, from returning to the main chamber 11 and prevent the backflow of the deposit DP by setting the time T2 to one second or less. The order of opening and closing of or the number of openings and closings of the first to fourth exhaust holes 111 to 114 is not specifically limited. The times for opening the first to fourth exhaust holes 111 to 114 may be the same or different from each other. Two, three, or four of the first to fourth exhaust holes 111 to 114 may be simultaneously opened and closed.

It is preferable that the time for the first removal step is from ten minutes to thirty minutes. It is possible to sufficiently remove the deposit DP by setting the time to ten minutes or greater. It is possible to prevent the cleaning time from becoming lengthy by setting the time to thirty minutes or less.

The cleaning device 5 performs the second removal step subsequent to the first removal step.

In the second removal step, firstly, the cleaning control device 59 opens all of the first to fourth exhaust holes 111 to 114 while maintaining the drive of the blower 29 and the introduction of nitrogen into the main chamber 11. Then, after the atmospheric air is introduced into the main chamber 11 by shifting the lid 55 in the lateral direction or in an upward direction, the introduction of nitrogen is ended.

Accordingly, the atmospheric air to which no pulsation is applied flows into the exhaust pipe 21 through the first to fourth exhaust holes 111 to 114 to enable the deposit DP in the first to fourth branch pipes 211 to 214 and the exhaust pipe 21 downstream thereof to be burned. In this case, since the deposit DP is thinned by the peeling of the surface layer of the deposit DP in the first removal step, it is possible to burn the deposit DP over the entire area in a thickness direction thereof. In addition, since the atmospheric air to which no pulsation is applied is used, the atmospheric air does not rapidly react with an unburned part of the deposit DP; and thereby, it is possible to prevent ignition. Then, since the deposit DP is thin, even when the atmospheric air to which no pulsation is applied and which does not have a strong peeling force is used, it is possible to peel and remove the entire remainder of the deposit DP.

Incidentally, the atmospheric air to which no pulsation is applied may flow into the exhaust pipe 21 by providing a valve in the lid 55 and opening the valve or by shifting the second divided chamber 11B or the third divided chamber 11C in the lateral direction or in the upward direction to form a gap.

It is preferable that the time for the second removal step is from five minutes to twenty minutes. It is possible to sufficiently oxidize the deposit DP by setting the time to five minutes or greater. In addition, it is possible to prevent the cleaning time from becoming lengthy by setting the time to twenty minutes or less.

The cleaning device 5 performs the third removal step subsequent to the second removal step. Incidentally, the third removal step may not be performed.

Except for performing an atmospheric air filling step instead of the inert gas filling step performed in the first removal step, the third removal step is the same as the first removal step.

Specifically, the cleaning control device 59 closes the first to fourth exhaust holes 111 to 114 substantially simultaneously to partition the main chamber 11 off from the blower 29, to fill the main chamber 11 with the atmospheric air, and to bring the pressure in the exhaust pipe 21 to a negative pressure (atmospheric air filling step). Then, when a time T3 from the closing of the first to fourth exhaust holes 111 to 114 has elapsed, the cleaning control device 59 opens the first exhaust hole 111 for a time T4 to allow the atmospheric air to which pulsation is applied to flow into the exhaust pipe 21 through the first exhaust hole 111 (pulsation applying step).

Accordingly, even when the deposit DP cannot be removed even in the second removal step to remain, it is possible to peel and remove the deposit DP from the first branch pipe 211 and the exhaust pipe 21 downstream thereof with a peeling force which is stronger than that when the atmospheric air to which no pulsation is applied is used. In addition, since the oxidation of the deposit DP is completed in the second removal step, the deposit DP is not ignited by the atmospheric air.

Thereafter, the cleaning control device 59 performs the atmospheric air filling step for the time T3, the pulsation applying step of opening only the second exhaust hole 112 for the time T4, the atmospheric air filling step for the time T3, the pulsation applying step of opening only the third exhaust hole 113 for the time T4, the atmospheric air filling step for the time T3, and the pulsation applying step of opening only the fourth exhaust hole 114 for the time T4.

Thereafter, the cleaning control device 59 ends the third removal step, as necessary, by sequentially performing the atmospheric air filling step and the pulsation applying step of opening and closing only one of the first to fourth exhaust holes 111 to 114, and then opening all of the first to fourth exhaust holes 111 to 114.

Incidentally, the time T4 for opening the first to fourth exhaust holes 111 to 114 depends on the size of the main chamber 11, and it preferable that the time T4 is one second or less. It is possible to prevent reflected waves of the atmospheric air, which has flown into the exhaust pipe 21, from returning to the main chamber 11 and prevent the backflow of the deposit DP by setting the time T4 to one second or less. The order of opening of or the number of openings of the first to fourth exhaust holes 111 to 114 is not specifically limited. The times for opening the first to fourth exhaust holes 111 to 114 may be the same or different from each other. Two, three, or four of the first to fourth exhaust holes 111 to 114 may be simultaneously opened.

It is preferable that the time for the third removal step is from ten minutes to thirty minutes. It is possible to sufficiently remove the deposit DP by setting the time to ten minutes or greater. In addition, it is possible to prevent the cleaning time from becoming lengthy by setting the time to thirty minutes or less.

Advantage(s) of Embodiment

Since in the first removal step, the deposit DP is peeled off using the nitrogen gas to which pulsation is applied, and in the subsequent second removal step, the remainder of the deposit DP is peeled off using the atmospheric air to which no pulsation is applied, it is possible to properly remove the deposit DP while preventing the ignition of the deposit DP deposited in the exhaust pipe 21.

In particular, since the first to fourth branch pipes 211 to 214 are close to the chamber 14 and lower ends thereof are bent, the deposit DP is easily deposited. In this embodiment, since the nitrogen gas to which pulsation is applied flows into the first to fourth branch pipes 211 to 214 to remove the deposit DP therefrom, it is possible to enhance the effect of preventing the deposit DP from flowing back to the chamber 14. Therefore, during the production of the silicon single crystal SM which is performed after cleaning, it is prevented that the deposit DP flows back to the chamber 14 and is mixed with the silicon melt M or the silicon single crystal SM to cause a dislocation; and thereby, it is possible to improve the productivity of the silicon single crystal SM.

Since instead of the vacuum pump 27, the blower 29 is used in the first to third removal steps, it is possible to remove the deposit DP with a strong peeling force.

Since only one exhaust hole is opened and closed in the first and third removal steps, it is possible to further increase the amount of the nitrogen gas or the atmospheric air flowing into each exhaust hole and each branch pipe than that when a plurality of the exhaust holes are simultaneously opened and closed, and it is possible to intensity the peeling force in the exhaust hole or the branch pipe without increasing the differential pressure.

The gravel trap 25 provided in the second rising portion 215C can trap the deposit DP by a simple method using only the own weight of the deposit DP. In addition, it is possible to trap the deposit DP which is heavy and falls due to the own weight; and thereby, it is possible to prevent damage to the blower 29 which is caused by collision with the deposit DP which is heavy.

Since the powder trap 26 can trap light powder that has passed through the second rising portion 215C, it is possible to prevent a failure of the blower 29 which is caused due to the powder adhering thereto.

In addition, since the deposit DP which cannot be removed in the first and second removal steps can be removed by performing the third removal step, it is possible to further reduce the possibility of the deposit DP flowing back to the chamber 14, and it is possible to further improve the productivity of the silicon single crystal SM.

Furthermore, since the burning step is performed before the first removal step, it is possible to easily remove the deposit DP in the first removal step.

Modification Example

Incidentally, the present invention is not limited to only the foregoing embodiment, and various improvements, design changes, or the like can be made without departing from the concept of the present invention.

For example, the deposit DP may be removed using the vacuum pump 27 instead of the blower 29 in at least one step of the first to third removal steps, and in this case, it is preferable that the exhaust capacity of the vacuum pump 27 can be increased to remove the deposit DP. When the vacuum pump 27 is used in all of the first to third removal steps, it is not necessary to provide the blower in the single crystal pulling-up system 1 in the related art, and it is possible to prevent the configuration from becoming complicated or an increase in cost.

In the first removal step, as a method for causing nitrogen to which pulsation is applied to flow into the exhaust pipe 21, nitrogen with the main chamber 11 is filled may not be caused to flow into the exhaust pipe 21, but instead of the first to fourth exhaust hole opening and closing means 51 to 54, for example, nozzles may be connected to the first to fourth exhaust holes 111 to 114, and nitrogen or the atmospheric air may be directly supplied from the filling nitrogen supply means 58 through the nozzles.

In the third removal step, as a method for of causing the atmospheric air to which pulsation is applied to flow into the exhaust pipe 21, instead of the first to fourth exhaust hole opening and closing means 51 to 54, for example, the nozzles may be connected to the first to fourth exhaust holes 111 to 114, and the atmospheric air may be supplied through the nozzles.

The inert gas used in the first removal step may be an Ar gas, a helium gas, or a neon gas.

In the second removal step, as a method for causing the atmospheric air to which no pulsation is applied to flow into the exhaust pipe 21, while the main chamber 11 is sealed with the lid 55, the atmospheric air may be caused to flow into the exhaust pipe 21 through the filling nitrogen supply pipe 61 or a supply pipe provided separately from the filling nitrogen supply pipe 61.

As a method for generating the differential pressure between the main chamber 11 and the exhaust pipe 21 and pulsation, instead of using the first to fourth pistons 51A to 54A, the main valve 23 or the conductance valve 24 which is disposed under the floor may be opened and closed to generate the differential pressure and the pulsation.

After the silicon single crystal SM is produced, the first to third removal steps may be performed without performing the burning step.

EXAMPLES

Subsequently, the invention will be described in more detail with examples and comparative examples; however, the invention is not limited in any way by these examples.
[First Experiment: Regarding Differential Pressure Between Chamber and Exhaust Pipe when Exhaust Hole is Opened and Closed in First Removal Step]
[Experimental Method]

First Comparative Example

The single crystal pulling-up system 1 and the cleaning device 5 of the foregoing embodiment were prepared. The inner diameter of the branch pipe was set to 70 mm. Then, a silicon single crystal doped with red phosphorus as an n-type dopant was produced and the burning step was performed once, and then cleaning was performed using the cleaning device 5.

In the first removal step, forty two cycles of the inert gas filling steps and the pulsation applying steps were performed on each of the first to fourth branch pipes 211 to 214. During the first removal step, the exhaust air amount of the blower 29 was set to 5 m³/min. The nitrogen gas to which pulsation was applied was allowed to flow into the exhaust pipe 21 by opening one of the first to fourth exhaust holes 111 to 114 for one second at a point in time when the differential pressure between the main chamber 11 and the exhaust pipe 21 became 1 kPa.

Thereafter, the second removal step was performed for fifteen minutes without changing the exhaust air amount of the blower 29.

Second Comparative Example

Except that in the inert gas filling step, the differential pressure between the main chamber 11 and the exhaust pipe 21 when the first to fourth exhaust holes 111 to 114 were open was set to 5 kPa, the same experiment as that in the first comparative example was performed.

First Example

Except that in the inert gas filling step, the differential pressure between the main chamber 11 and the exhaust pipe 21 when the first to fourth exhaust holes 111 to 114 were open was set to 20 kPa, the same experiment as that in the first comparative example was performed.
[Evaluation]

The states of removal of the deposit DP in the first to fourth branch pipes 211 to 214 after cleaning were compared to each other.

In the second comparative example, the residual amount of the deposit DP was smaller than that in the first comparative example; however, in both of the first and second comparative examples, the deposit DP remained.

On the other hand, in the first example, the deposit DP did not remain, and the removal capability was better than that when an operator performed a manual operation with a brush.

As such, it was confirmed that when the differential pressure between the main chamber 11 and the exhaust pipe 21 was set to 20 kPa or greater and then the first to fourth exhaust holes 111 to 114 were opened and closed to apply pulsation to the inert gas, the deposit DP was removable with a good removal capability.
[Second Experiment: Confirmation of Effects of Cleaning Method]
[Experimental Method]

Third Comparative Example

The single crystal pulling-up system 1 and the cleaning device 5 which were the same as those in the first experiment were prepared. Then, as shown in Table 1, in a state where the maximum pressure of the chamber 14 was set to 10 kPa, a silicon single crystal doped with antimony as an n-type dopant was produced and the burning step was performed once, and then cleaning was performed using the cleaning device 5.

Only the cleaning performed was the second removal step (denoted as [2] in Table 1) of the foregoing embodiment.

In the second removal step, a process of causing the atmospheric air to flow into the exhaust pipe 21 through the first to fourth branch pipes 211 to 214 was performed for fifteen minutes with the blower 29 having an exhaust air amount set to 5 m³/min.

Fourth Comparative Example

Except that arsenic was used as a dopant and the maximum pressure of the chamber 14 was set to 30 kPa, an experiment was performed under the same conditions as those in the third comparative example.

Fifth Comparative Example

Except that red phosphorus was used as a dopant and the maximum pressure of the chamber 14 was set to 40 kPa, an experiment was performed under the same conditions as those in the third comparative example.

Sixth Comparative Example

Except that as cleaning, after the same second removal step as that in the third comparative example was performed, the third removal step (denoted as [3] in Table 1) of the foregoing embodiment was performed, an experiment was performed under the same conditions as those in the third comparative example.

In the third removal step, forty two cycles of the atmospheric air filling steps and the pulsation applying steps were performed on each of the first to fourth branch pipes 211 to 214. During the third removal step, the exhaust air amount of the blower 29 was set to the same as in the second removal step. The atmospheric air to which pulsation was applied was allowed to flow into the exhaust pipe 21 by opening one of the first to fourth exhaust holes 111 to 114 for one second at a point in time when the differential pressure between the main chamber 11 and the exhaust pipe 21 became 20 kPa.

Seventh Comparative Example

Except that arsenic was used as a dopant and the maximum pressure of the chamber 14 was set to 30 kPa, an experiment was performed under the same conditions as those in the sixth comparative example.

Eighth Comparative Example

Except that red phosphorus was used as a dopant and the maximum pressure of the chamber 14 was set to 40 kPa, an experiment was performed under the same conditions as those in the sixth comparative example.

Second Example

Except that as cleaning, after the first removal step (denoted as [1] in Table 1) was performed, the same second removal step as that in the third comparative example was performed, an experiment was performed under the same conditions as those in the third comparative example.

In the first removal step, one cycle of the inert gas filling step and the pulsation applying step was performed on each of the first to fourth branch pipes 211 to 214. During the first removal step, the exhaust air amount of the blower 29 was set the same as in the second removal step. The nitrogen gas to which pulsation was applied was allowed to flow into the exhaust pipe 21 by opening one of the first to fourth exhaust holes 111 to 114 for one second at a point in time when the differential pressure between the main chamber 11 and the exhaust pipe 21 became 20 kPa.

Third Example

Except that arsenic was used as a dopant and the maximum pressure of the chamber 14 was set to 30 kPa, an experiment was performed under the same conditions as those in the second example.

Fourth Example

Except that red phosphorus was used as a dopant and the maximum pressure of the chamber 14 was set to 40 kPa, an experiment was performed under the same conditions as those in the second example.

[Evaluation]

Firstly, the states of removal of the deposit DP in the first to fourth branch pipes 211 to 214 after cleaning were compared to each other.

As shown in Table 1, in the third to fifth comparative examples, the deposit DP remained (NG); however, in the sixth to eighth comparative examples and the second to fourth examples, the deposit DP did not remain and the removal capability was better than that when an operator performed a manual operation with a brush (OK).

As such, it was found that a sufficient peeling force was not obtainable by only the atmospheric air to which no pulsation was applied, and a sufficient peeling force was obtainable by using the atmospheric air or the inert gas to which pulsation was applied.

In addition, a status of ignition in the exhaust pipe 21 during cleaning was checked.

As shown in Table 1, ignition occurred in the sixth to eighth comparative examples; however, ignition did not occur in the third to fifth comparative examples and the second to fourth examples.

From a comparison between the sixth to eighth comparative examples and the third to fifth comparative examples, it was confirmed that even though the same atmospheric air was used, when pulsation was applied to the atmospheric air, an unburned deposit rapidly reacted with the atmospheric air due to a pressure fluctuation to ignite, which was a concern, and when no pulsation was applied to the atmospheric air, since a large pressure fluctuation did not occur, an unburned deposit did not rapidly react with the atmospheric air, and thus, ignition was prevented.

In addition, from the comparison between the sixth to eighth comparative examples and the second to fourth examples, it was confirmed that even though pulsation was applied to a gas flowing into the exhaust pipe 21, when the atmospheric air was used as the gas, there was a concern of ignition, and when the inert gas was used, ignition was prevented.

In the summary of the above description, it was confirmed that when the first and second removal steps were performed as in the second to fourth examples, the deposit was removable while ignition was prevented.

TABLE 1

| | Dopant | Maximum pressure of chamber during growth of crystal [kPa] | Cleaning method | Status of removal of deposit | Status of ignition |
|---|---|---|---|---|---|
| Third comparative example | Antimony | 10 | [2] | NG | No occurrence |
| Fourth comparative example | Arsenic | 30 | [2] | NG | No occurrence |
| Fifth comparative example | Red phosphorus | 40 | [2] | NG | No occurrence |
| Sixth comparative example | Antimony | 10 | [2]→[3] | OK | Occurrence |

TABLE 1-continued

| | Dopant | Maximum pressure of chamber during growth of crystal [kPa] | Cleaning method | Status of removal of deposit | Status of ignition |
|---|---|---|---|---|---|
| Seventh comparative example | Arsenic | 30 | [2]→[3] | OK | Occurrence |
| Eighth comparative example | Red phosphorus | 40 | [2]→[3] | OK | Occurrence |
| Second examples | Antimony | 10 | [1]→[2] | OK | No occurrence |
| Third examples | Arsenic | 30 | [1]→[2] | OK | No occurrence |
| Fourth examples | Red phosphorus | 40 | [1]→[2] | OK | No occurrence |

[Third Experiment: Confirmation of Influence of Cleaning Method on Production of Silicon Single Crystal]

Ninth Comparative Example

The single crystal pulling-up system 1 and the cleaning device 5 which were the same as those in the first experiment were prepared. Then, in a state where the maximum pressure of the chamber 14 was set to 60 kPa and the flow rate of the Ar gas introduced into the chamber 14 was set to 150 L/min, the silicon single crystal SM doped with red phosphorus as an n-type dopant was produced and the burning step was performed once. Thereafter, a production loss time when an operator removed the deposit DP from the exhaust pipe 21 by a manual operation using a brush and then the silicon single crystal SM was produced again under the foregoing conditions was examined.

The production loss time in this example implies a time unnecessary for the growth of the silicon single crystal SM that is finally obtained. When the deposit DP remains in the exhaust pipe 21, during the production of the silicon single crystal SM, the deposit DP flows back into the chamber 14 and is mixed with the silicon melt M or the silicon single crystal SM to cause a dislocation, which is a concern. When the dislocation occurs, the growth is stopped, the silicon single crystal SM is melted with the silicon melt M (hereinafter, referred to as "remelting"), and the silicon single crystal SM is newly regrown. When such a regrowth is performed, a time from the start of formation of a neck portion of the silicon single crystal SM before remelting (before initial remelting when remelting is performed a plurality of times) to the start of formation of a neck portion of the silicon single crystal SM that is finally obtained is referred to as the production loss time.

Tenth Comparative Example

Except that the maximum pressure of the chamber 14 was set to 80 kPa and the flow rate of the Ar gas introduced into the chamber 14 was set to 60 L/min, an experiment was performed under the same conditions as those in the ninth comparative example.

Fifth Example

Except that the removal of the deposit DP from the exhaust pipe 21 was performed in the first and second removal steps of the foregoing embodiment, an experiment was performed under the same conditions as those in the ninth comparative example.

In the first removal step, forty two cycles of the inert gas filling steps and the pulsation applying steps were performed on each of the first to fourth branch pipes 211 to 214. During the first removal step, the exhaust air amount of the blower 29 was set the same as in the second removal step. The nitrogen gas to which pulsation was applied was allowed to flow into the exhaust pipe 21 by opening one of the first to fourth exhaust holes 111 to 114 for one second at a point in time when the differential pressure between the main chamber 11 and the exhaust pipe 21 became 20 kPa.

In the second removal step, a process of causing the atmospheric air to flow into the exhaust pipe 21 through the first to fourth branch pipes 211 to 214 was performed for fifteen minutes with the blower 29 having an exhaust air amount set to 5 m$^3$/min.

Sixth Example

Except that the maximum pressure of the chamber 14 was set to 80 kPa and the flow rate of the Ar gas introduced into the chamber 14 was set to 60 L/min, an experiment was performed under the same conditions as those in the fifth example.

[Evaluation]

As shown in Table 2, the experiment was performed forty two times in the ninth comparative example, sixteen times in the tenth comparative example, four times in the fifth example, and five times in the sixth example. Then, the production loss time in each experiment was checked.

Figure 6:
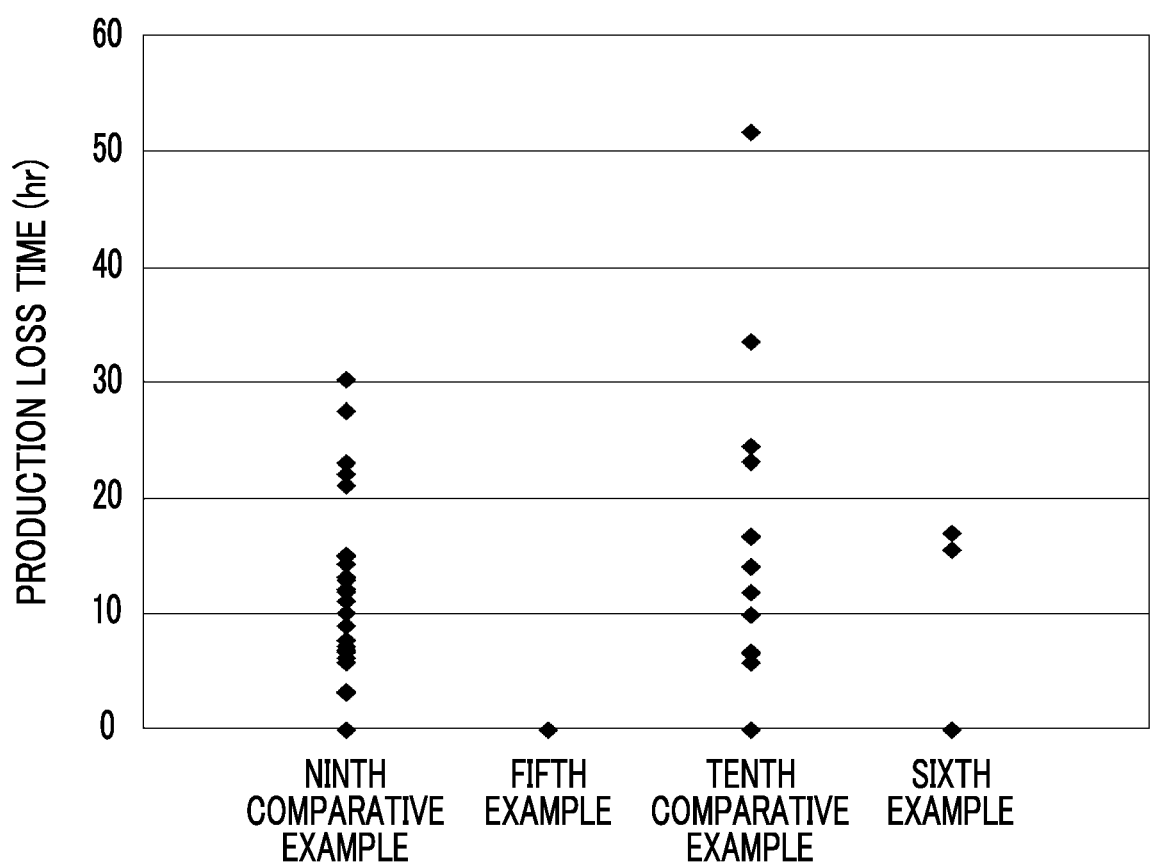
FIG. 6 is a scatter plot illustrating a relationship between the cleaning method and a production loss time in an example of the invention.

FIG. 6 illustrates a distribution of the production loss time, and Table 2 shows average values and standard deviations.

As shown in FIG. 6 and Table 2, the ninth and tenth comparative examples had a longer production loss time and a larger variation in production loss time than those in the fifth and sixth examples where the pressure of the chamber 14 and the flow rate of the Ar gas were the same as those in the ninth and tenth comparative examples.

It is conceivable that when cleaning is performed by a manual operation using a brush as in the ninth and tenth comparative examples, since the deposit DP cannot be sufficiently removed, the deposit DP flows back to the chamber 14 to cause a dislocation. On the other hand, it is conceivable that when cleaning is performed in the first and second removal steps as in the fifth and sixth examples, since the deposit DP can be sufficiently removed, the deposit DP can be prevented from flowing back to the chamber 14 and an occurrence of a dislocation is prevented.

In addition, when the ninth comparative example and the fifth example were compared to the tenth comparative example and the sixth example, the production loss times in the ninth comparative example and the fifth example were shorter than those in the tenth comparative example and the sixth example.

It is conceivable that since the flow rate of the Ar gas is smaller in the tenth comparative example and the sixth example, a large amount of the deposit DP flows back to the chamber 14.

TABLE 2

| | Chamber pressure [kPa] | Flow rate of Ar [L/min] | Number of experiments | Manufacturing loss time [hr] Average value | Manufacturing loss time [hr] Standard deviation |
|---|---|---|---|---|---|
| Ninth comparative example | 60 | 150 | 42 | 7.57 | 8.401 |
| Fifth examples | 60 | 150 | 4 | 0.00 | 0.000 |
| Tenth comparative example | 80 | 60 | 16 | 14.74 | 13.651 |
| Sixth examples | 80 | 60 | 5 | 6.53 | 8.959 |

The invention claimed is:

1. A cleaning method for removing a deposit containing an evaporated substance of a dopant deposited in an exhaust pipe in a single crystal pulling-up system comprising a chamber and the exhaust pipe that exhaust a gas in the chamber, the method comprising:
    after a silicon single crystal doped with an n-type dopant is produced,
    a burning process of causing atmospheric air to which no pulsation is applied to flow into the exhaust pipe through the chamber to burn a part of the deposit with atmospheric air;
    after the burning process, a first removal process of causing an inert gas to which a pulsation is applied to flow into the exhaust pipe, to peel and remove a further part of the deposit; and
    a second removal process of causing atmospheric air to which no pulsation is applied to flow into the exhaust pipe through the chamber to burn at least another part of the deposit with atmospheric air, the at least another part of the deposit being unremoved in the first removal process, and the second removal process peeling and removing a burned substance of the at least another part of the deposit.

2. The cleaning method according to claim 1,
    wherein the single crystal pulling-up system is provided with a vacuum pump that regulates a pressure in the chamber during production of the silicon single crystal, and a blower that suctions the deposit in the exhaust pipe,
    the first removal process peels the further part of the deposit and suctions the further part of the deposit with the blower by causing the inert gas to which the pulsation is applied to flow into the exhaust pipe in a state where a drive of the vacuum pump is stopped and the blower is driven, and
    the second removal process peels the burned substance of the at least another part of the deposit and suctions the burned substance of the at least another part of the deposit with the blower.

3. The cleaning method according to claim 1,
    wherein the single crystal pulling-up system is provided with a vacuum pump that regulates a pressure in the chamber during production of the silicon single crystal,
    the first removal process peels the further part of the deposit and suctions the further part of the deposit with the vacuum pump by causing the inert gas to which the pulsation is applied to flow into the exhaust pipe in a state where the vacuum pump is driven, and
    the second removal process peels the burned substance of the at least another part of the deposit and suctions the burned substance of the at least another part of the deposit with the vacuum pump.

4. The cleaning method according to claim 1,
    wherein the chamber comprises a main chamber and a pull chamber,
    in the first removal process, the pull chamber is removed from the main chamber and an exhaust hole valve is disposed in an exhaust hole in the main chamber which communicates with an inside of the exhaust pipe, a connection opening in the main chamber, which is connected to the pull chamber, is closed with a lid, the exhaust hole valve closes the exhaust hole to bring a pressure in the exhaust pipe to a negative pressure, the main chamber is filled with the inert gas through a supply pipe provided in the lid, and the exhaust hole valve opens and closes the exhaust hole to generate a pressure fluctuation in the exhaust pipe, which causes the pressure in the exhaust pipe to return to a pressure of the main chamber, so that the inert gas to which the pulsation is applied flows into the exhaust pipe, and
    in the second removal process, the exhaust hole valve opens the exhaust hole, and the lid is moved away from the connection opening or a valve provided in the lid is opened, so that atmospheric air to which no pulsation is applied flows into the exhaust pipe.

5. The cleaning method according to claim 1,
    wherein the chamber comprises a main chamber and a pull chamber,
    the main chamber comprises a plurality of divisible chambers,
    in the first removal process, the pull chamber is removed from the main chamber and an exhaust hole valve is disposed in an exhaust hole in the main chamber which communicates with an inside of the exhaust pipe, a connection opening in the main chamber, which is connected to the pull chamber, is closed with a lid, the exhaust hole valve closes the exhaust hole to bring a pressure in the exhaust pipe to a negative pressure, the main chamber is filled with the inert gas through a supply pipe provided in the lid, and the exhaust hole valve opens and closes the exhaust hole to generate a pressure fluctuation in the exhaust pipe, which causes the pressure in the exhaust pipe to return to a pressure of the main chamber, so that the inert gas to which the pulsation is applied flows into the exhaust pipe, and
    in the second removal process, the exhaust hole valve opens the exhaust hole and one of the plurality of divisible chambers is moved to form a gap between another divisible chamber and the one, so that atmospheric air to which no pulsation is applied flows into the exhaust pipe.

6. The cleaning method according to claim 4,
wherein a main chamber side end portion in the exhaust pipe is divided into a plurality of branch portions,
the main chamber is provided with a plurality of the exhaust holes that communicate with insides of the branch portions of the exhaust pipe, and
in the first removal process, the exhaust hole valve is a plurality of valves disposed in the plurality of exhaust holes, and a process of opening and closing the exhaust holes with at least one of the plurality of exhaust hole valves except for at least another one of the plurality of exhaust hole valves to cause the inert gas to which the pulsation is applied to flow into the exhaust pipe, and a process of filling the main chamber with the inert gas through the supply pipe are repeated a plurality of times.

7. The cleaning method according to claim 4,
wherein in the first removal process, after a differential pressure between the main chamber and the exhaust pipe becomes 20 kPa or greater, the exhaust hole is opened and closed to apply the pulsation to the inert gas.

8. The cleaning method according to claim 1,
wherein the exhaust pipe is provided with a rising portion extending vertically,
a falling object trap is provided at a lower end of the rising portion, and
in the first removal process and the second removal process, the further part of the deposit and the at least another part of the deposit are trapped by the falling object trap, wherein the further part of the deposit and the at least another part of the deposit are not passable through the rising portion and fall due to a weight of the further part of the deposit and a weight of the at least another part of the deposit.

9. A method for producing a silicon single crystal, the method comprising:
producing a silicon single crystal doped with an n-type dopant using a single crystal pulling-up system in which a deposit is removed from an exhaust pipe by the cleaning method according to claim 1.

10. The cleaning method according to claim 5,
wherein a main chamber side end portion in the exhaust pipe is divided into a plurality of branch portions,
the main chamber is provided with a plurality of the exhaust holes that communicate with insides of the branch portions of the exhaust pipe, and
in the first removal process, the exhaust hole valve is a plurality of valves disposed in the plurality of exhaust holes, and a process of opening and closing the exhaust holes with at least one of the plurality of exhaust hole valves except for at least another one of the plurality of exhaust hole valves to cause the inert gas to which the pulsation is applied to flow into the exhaust pipe, and a process of filling the main chamber with the inert gas through the supply pipe are repeated a plurality of times.

11. The cleaning method according to claim 5,
wherein in the first removal process, after a differential pressure between the main chamber and the exhaust pipe becomes 20 kPa or greater, the exhaust hole is opened and closed to apply the pulsation to the inert gas.

* * * * *